(12) United States Patent
Nagaraj et al.

(10) Patent No.: US 12,388,362 B2
(45) Date of Patent: Aug. 12, 2025

(54) CHARGE PUMPING USING ADJUSTABLE CAPACITOR

(71) Applicant: Infineon Technologies Canada Inc., Ottawa (CA)

(72) Inventors: Krishnaswamy Nagaraj, Ashburn, VA (US); Nan Xing, Allen, TX (US); Sridhar Ramaswamy, Allen, TX (US); Edward MacRobbie, Nepean (CA); Robert Wayne Mounger, Dallas, TX (US); Lucas Andrew Milner, Sunnyvale, CA (US)

(73) Assignee: Infineon Technologies Canada Inc., Ottawa (CA)

( * ) Notice: Subject to any disclaimer, the term of this patent is extended or adjusted under 35 U.S.C. 154(b) by 142 days.

(21) Appl. No.: 18/350,664

(22) Filed: Jul. 11, 2023

(65) Prior Publication Data

US 2025/0023464 A1  Jan. 16, 2025

(51) Int. Cl.
*H02M 3/00* (2006.01)
*H02M 3/07* (2006.01)
*H02M 3/135* (2006.01)

(52) U.S. Cl.
CPC ............. *H02M 3/07* (2013.01); *H02M 3/135* (2013.01)

(58) Field of Classification Search
CPC ...... H02M 3/135; H02M 3/137; H02M 3/139; H02M 3/155; H02M 3/07
See application file for complete search history.

(56) References Cited

U.S. PATENT DOCUMENTS

| 5,615,096 A * | 3/1997 | Stengel | H01L 23/5222 363/60 |
| 2007/0085573 A1* | 4/2007 | Henzler | H03K 17/163 327/143 |
| 2009/0052096 A1* | 2/2009 | Takahashi | H02M 1/08 361/18 |
| 2015/0049008 A1* | 2/2015 | Wu | G09G 3/3648 345/87 |

(Continued)

FOREIGN PATENT DOCUMENTS

CN  110247545 A  9/2019

OTHER PUBLICATIONS

European Search Report received for application No. 24187491.6-1211 Nov. 12, 2024, 15 Pages.

*Primary Examiner* — Tuan T Lam
(74) *Attorney, Agent, or Firm* — WORKMAN NYDEGGER

(57) ABSTRACT

A voltage supply circuit that generates a voltage on a voltage supply node. The voltage supply circuit includes an adjustable capacitor, an alternating voltage source, a charge source, and an adjusting circuit. When the alternating voltage on the second capacitor terminal transitions low, the voltage on the first capacitor terminal also becomes low, and the charge source provides charge to the first capacitor terminal of the adjustable capacitor. When the alternating voltage on the second capacitor terminal transitions high, the voltage on the first capacitor terminal also becomes high, and charge is thereby pumped from the first capacitor terminal to the voltage supply node. The adjusting circuit periodically samples the voltage on the voltage supply node, and adjusts the capacitance of the adjustable capacitor to increase or decrease that voltage.

14 Claims, 6 Drawing Sheets

(56) References Cited

U.S. PATENT DOCUMENTS

2019/0386563 A1\* 12/2019 Cohen ..................... G06F 1/266
2021/0342661 A1\* 11/2021 Pichler ............... G06K 19/0715
2022/0247352 A1\* 8/2022 Toriumi ................... H03B 5/32

\* cited by examiner

CHARGE PUMPING USING ADJUSTABLE CAPACITOR

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current-hence the term "field-effect transistor".

Nevertheless, there are other types of transistors. In each transistor, current flows from an input node to an output node through a channel when the transistor is turned on by applying a sufficient voltage to a control node. For instance, in a field-effect transistor, the control node would be the gate terminal, the input node would be one of the source or drain terminals, and the output node would be the other of the source or drain terminals.

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater.

Accordingly, a power transistor may have a specified power safety rating under which the power transistor may be safely operated normally for extended periods of time. However, a power transistor may be operated in an overdrive mode in which the power transistor may operate higher than its specified power safety rating for a short period of time without causing significant damage to the power transistor. A power transistor may be pushed into overdrive mode by, for example, applying a higher control voltage to its control node, the higher control voltage being larger than a sufficient control voltage to turn on the power transistor such that the power transistor operates normally.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a voltage supply circuit that generates a voltage on a voltage supply node. As a specific example, the voltage supply circuit may use the generated voltage on the voltage supply node to control the operation of a power transistor (e.g., a field-effect transistor). For example, the voltage supply circuit may cause the power transistor to be turned off (e.g., by applying 0V to a control node of the power transistor), to be turned on (e.g., by applying 6V), or to enter an overdrive mode (e.g., by applying 8V). However, the principles described herein are not limited to how the generated voltage on the voltage supply node is used.

The voltage supply circuit includes an adjustable capacitor, an alternating voltage source, and a charge source. The adjustable capacitor has two capacitor terminals. One of the capacitor terminals (which will be called herein the "first capacitor terminal") is coupled to both the voltage supply node and the charge source. The opposite terminal (called herein the "second capacitor terminal") is connected to the alternating voltage source, which provides an alternating voltage to the second capacitor terminal, where the alternating voltages alternates in a repeating period that each include one transition low and one transition high.

When the alternating voltage on the second capacitor terminal transitions low, the voltage on the first capacitor terminal is connected to a charge source, which provides charge to the first capacitor terminal of the adjustable capacitor. On the other hand, when the alternating voltage on the second capacitor terminal transitions high, the first terminal is coupled to the voltage supply node and charge is thereby pumped from the first capacitor terminal to the voltage supply node. Accordingly, the adjustable capacitor, alternating voltage source, and charge source may be used to replenish the generated voltage on the voltage supply node by pumping charge to the voltage supply node in each period.

To replenish the correct amount of voltage to the voltage supply node in each period, the voltage supply circuit further includes an adjusting circuit. The adjusting circuit periodically (e.g., once per period of the alternating voltage) samples the voltage on the voltage supply node, and determines whether the voltage on the voltage supply node is too low below or too high above a specified voltage. If the adjusting circuit determines that the voltage on the voltage supply node is too low below the specified voltage, the adjusting circuit adjusts the capacitance of the adjustable capacitor upward. Increasing the capacitance of the adjustable capacitor increases the amount of charge the adjustable capacitor can pump to the voltage supply node in a period. Accordingly, by increasing the capacitance of the adjustable capacitor, the generated voltage on the voltage supply node may be increased closer to the specified voltage.

Further, if the adjusting circuit determines that the voltage on the voltage supply node is too high above a specified voltage, the adjusting circuit adjusts the capacitance of the adjustable capacitor downward. Decreasing the capacitance of the adjustable capacitor decreases the amount of charge the adjustable capacitor can pump to the voltage supply node in a period. Accordingly, by decreasing the capacitance of the adjustable capacitor, the generated voltage on the voltage supply node may be decreased closer to the specified voltage.

Accordingly, the voltage supply circuit is capable of accurately generating a specified voltage (or otherwise carefully controlling the voltage) on the voltage supply node by adjusting the capacitance of the adjustable capacitor upwards or downwards depending on whether the sampled voltage on the voltage supply node is respectively less than a specified voltage or greater than a specified voltage.

Further, frequent automatic capacitance adjustment allows the voltage supply circuit to continue to accurately generate the specified voltage on the voltage supply node, continually compensating for changes such as aging of the components in the voltage supply circuit, operating temperature changes, or other sudden or gradual environmental changes. Furthermore, trimming of the capacitance of the adjustable capacitor to account for device-to-device manufacturing deviations or defects may be avoided, since the capacitance will be adjusted in normal operation.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION

Figure 1:
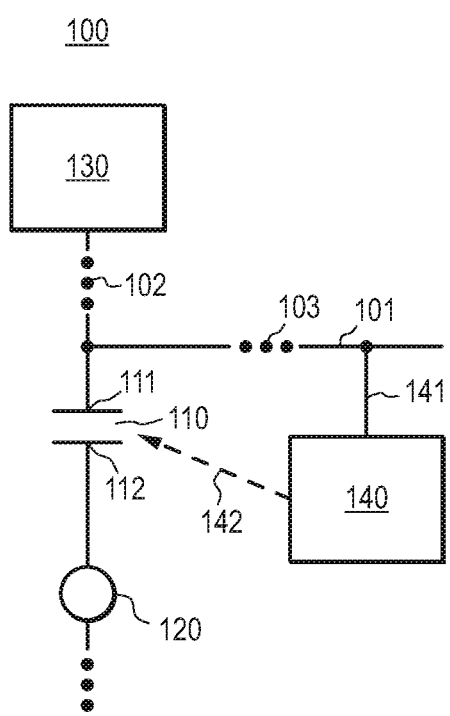
FIG. 1 illustrates a voltage supply circuit in which the principles described herein may be practiced, and is just one example of a voltage supply circuit that is consistent with the principles described herein.

Embodiments described herein relate to a voltage supply circuit that generates a voltage on a voltage supply node. As a specific example, the voltage supply circuit may use the generated voltage on the voltage supply node to control the operation of a power transistor (e.g., a field-effect transistor). For example, the voltage supply circuit may cause the power transistor to be turned off (e.g., by applying 0V to a control node of the power transistor), to be turned on (e.g., by applying 6V), or to enter an overdrive mode (e.g., by applying 8V). However, the principles described herein are not limited to how the generated voltage on the voltage supply node is used.

The voltage supply circuit includes an adjustable capacitor, an alternating voltage source, and a charge source. The adjustable capacitor has two capacitor terminals. One of the capacitor terminals (which will be called herein the "first capacitor terminal") is coupled to both the voltage supply node and the charge source. The opposite terminal (called herein the "second capacitor terminal") is connected to the alternating voltage source, which provides an alternating voltage to the second capacitor terminal, where the alternating voltages alternates in a repeating period that each include one transition low and one transition high.

When the alternating voltage on the second capacitor terminal transitions low the first capacitor terminal is coupled to a charge source which provides charge to the first capacitor terminal of the adjustable capacitor. On the other hand, when the alternating voltage on the second capacitor terminal transitions high, the first capacitor terminal may be de-coupled from the charge source and is coupled to the voltage supply node and charge is thereby pumped from the first capacitor terminal to the voltage supply node. Accordingly, the adjustable capacitor, alternating voltage source, and charge source may be used to replenish the generated voltage on the voltage supply node by pumping charge to the voltage supply node in each period.

To replenish the correct amount of voltage to the voltage supply node in each period, the voltage supply circuit further includes an adjusting circuit. The adjusting circuit periodically (e.g., once per period of the alternating voltage) samples the voltage on the voltage supply node, and determines whether the voltage on the voltage supply node is too low below or too high above a specified voltage. If the adjusting circuit determines that the voltage on the voltage supply node is too low below the specified voltage, the adjusting circuit adjusts the capacitance of the adjustable capacitor upward. Increasing the capacitance of the adjustable capacitor increases the amount of charge the adjustable capacitor can pump to the voltage supply node in a period. Accordingly, by increasing the capacitance of the adjustable capacitor, the generated voltage on the voltage supply node may be increased closer to the specified voltage.

Further, if the adjusting circuit determines that the voltage on the voltage supply node is too high above a specified voltage, the adjusting circuit adjusts the capacitance of the adjustable capacitor downward. Decreasing the capacitance of the adjustable capacitor decreases the amount of charge the adjustable capacitor can pump to the voltage supply node in a period. Accordingly, by decreasing the capacitance of the adjustable capacitor, the generated voltage on the voltage supply node may be decreased closer to the specified voltage.

Accordingly, the voltage supply circuit is capable of accurately generating a specified voltage (or otherwise carefully controlling the voltage) on the voltage supply node by adjusting the capacitance of the adjustable capacitor upwards or downwards depending on whether the sampled voltage on the voltage supply node is respectively less than a specified voltage or greater than a specified voltage. Further, frequent automatic capacitance adjustment allows the voltage supply circuit to continue to accurately generate the specified voltage on the voltage supply node, continually compensating for changes such as aging of the components in the voltage supply circuit, operating temperature changes, or other sudden or gradual environmental changes. Furthermore, trimming of the capacitance of the adjustable capacitor to account for device-to-device manufacturing deviations or defects may be avoided, since the capacitance will be adjusted in normal operation.

FIG. 1 illustrates a voltage supply circuit 100 in which the principles described herein may be practiced, and is just one example of a voltage supply circuit that is consistent with the principles described herein. The voltage supply circuit 100 is structured to supply a voltage to a voltage supply node 101. The voltage on the voltage supply node 101 may be used to provide power to components (not shown) that may be coupled to the voltage supply circuit 100, such as, for example, a power transistor (not shown). However, the principles described herein are not limited to the types of components that receive power from the voltage supply node 101, and/or the reasons for generation of the voltage on the voltage supply node 101.

The voltage supply circuit 100 includes an adjustable capacitor 110, an alternating voltage source 120, and a charge source 130. In one embodiment, the charge source 130 may be powered by the voltage supply node 101. However, the principles described herein are not limited to how the charge source 130 receives power.

The adjustable capacitor 110 is "adjustable" because the adjustable capacitor 110 has a capacitance that can be adjusted. The adjustability of this capacitance is used to control a voltage present on the voltage supply node 101 as will be described hereinafter. The adjustable capacitor has two terminals. One terminal 111 (called hereinafter the "first terminal 111") is coupled to both the voltage supply node 101 and the charge source 130. The other terminal 112 (called hereinafter the "second terminal 112" merely to distinguish from the first terminal 111) is connected to the alternating voltage source 120.

In this description and in the claims, circuit elements are "connected" to each other if they are directly connected without any explicit intervening circuit elements connected therebetween. For example, the alternating voltage source 120 and the second capacitor terminal 112 are "connected" because there are no explicit intervening circuit elements between the alternating voltage source 120 and the second capacitor terminal 112. All real-world circuits portions have some electrical properties that are not ideal-such as for example, "parasitic" resistance, inductance, or capacitance. Thus, two circuit elements are "connected" to each other even though a conductor with some resistance may connect the two circuit elements.

On the other hand, circuit elements are "coupled" to each other if charge is able to pass from one of those circuit elements to the other circuit element either because the circuit elements are connected, or because the charge can pass via some intervening circuit element(s) if certain conditions are met. For example, the ellipsis 102 represents that the charge source 130 and the first capacitor terminal 111 are "coupled" together either directly, or via some intervening circuit element(s) such that if a condition is met, then charge flows from the charge source 130 to the first capacitor terminal 111. This condition may be that a voltage present on the first capacitor terminal 111 is a threshold voltage lower than a voltage present at the charge source 130. The ellipsis 103 represents that the first capacitor terminal 111 and the voltage supply node 101 are "coupled" together such that when a condition is met, charge is able to pass from the first capacitor terminal 111 to the voltage supply node 101. This condition may be that a voltage present on the first capacitor terminal 111 is a threshold voltage higher than a voltage present on the voltage supply node 101.

The alternating voltage source 120 provides an alternating voltage to the second capacitor terminal 112. The alternating voltage alternates between two voltage levels in a repeating period. For instance, when the alternating voltage transitions low, the alternating voltage decreases from a higher voltage (also called herein, a "second voltage") to a lower voltage (also called herein a "first voltage"). Also, when the alternating voltage transitions high, the alternating voltage increases from the first voltage back to the second voltage. Each period of the repeating period thus includes both a transition low and a transition high.

Furthermore, when the alternating voltage transitions low or transitions high, the transition could be practically instantaneous, such as would be the case if the alternating voltage took substantially the form of a square wave. Alternatively, when the alternating voltage transitions low or transitions high, the transition could be gradual, such as would be the case if the alternating voltage substantially took the form of a sinusoidal wave. Further, each period of the alternating voltage may include an approximately equal amount of time of the alternating voltage being at its lower voltage and the alternating voltage being at its higher voltage. Alternatively, each period of the alternating voltage may include an unequal amount of time of the alternating voltage being at its lower voltage and the alternating voltage being at its higher voltage. However, the principles described herein are not limited to how immediate or gradual the alternating voltage transitions low and transitions high, and are not limited to the proportion of higher voltage to lower voltage of the alternating voltage that exists in each period of the alternating voltage.

When the alternating voltage on the second capacitor terminal 112 transitions low, the first capacitor terminal 111 is connected to the charge source 130 which provides charge to the first capacitor terminal 111 of the adjustable capacitor 110. On the other hand, when the alternating voltage on the second capacitor terminal 112 transitions high, the first capacitor terminal 111 may be de-coupled from the charge source 130 and is coupled to the voltage supply node 101 and charge is thereby pumped from the first capacitor terminal 111 to the voltage supply node 101. Accordingly, the adjustable capacitor 110, alternating voltage source 120, and charge source 130 may be used to replenish the generated voltage on the voltage supply node 101 in each period by 1) supplying the first capacitor terminal 111 with charge from the charge source 130 while the alternating voltage is low, and 2) pumping that charge from the first capacitor terminal 111 to the voltage supply node 101 while the alternating voltage is high.

To replenish the correct amount of voltage to the voltage supply node 101, the voltage supply circuit 100 further includes an adjusting circuit 140. The adjusting circuit 140 periodically (e.g., once per period of the alternating voltage) samples the voltage on the voltage supply node 101, and determines whether the voltage on the voltage supply node 101 is too low below or too high above a specified voltage. For instance, the adjusting circuit 140 is connected (as represented by line 141) to the voltage supply node 101 in order to perform the sampling of the voltage on the voltage supply node 101.

If the adjusting circuit 140 determines that the voltage on the voltage supply node 101 is too low below a specified voltage, the adjusting circuit 140 adjusts the capacitance of the adjustable capacitor 110 upward. The control involved with the adjusting circuit 140 making this adjustment is represented by dashed arrow 142. Increasing the capacitance of the adjustable capacitor 110 increases the amount of charge the adjustable capacitor 110 can pump to the voltage supply node 101 in a period. Accordingly, by increasing the capacitance of the adjustable capacitor 110, the generated voltage on the voltage supply node 101 may be increased.

Further, if the adjusting circuit 140 determines that the voltage on the voltage supply node 101 is too high above a specified voltage, the adjusting circuit 140 adjusts the capacitance of the adjustable capacitor 110 downward. Decreasing the capacitance of the adjustable capacitor 110 decreases the amount of charge the adjustable capacitor 110 can pump to the voltage supply node 101 in a period. Accordingly, by decreasing the capacitance of the adjustable capacitor 110, the generated voltage on the voltage supply node 101 may be decreased.

In one embodiment, as will be described with respect to FIG. 2, if the adjusting circuit 140 determines that the voltage on the voltage supply node 101 is not too low below a specified voltage, and is not too high above another specified voltage, the adjusting circuit 140 will not adjust the capacitance of the adjustable capacitor 110.

Accordingly, the voltage supply circuit 100 is capable of accurately generating a specified voltage (or otherwise carefully controlling the voltage) on the voltage supply node 101 by adjusting the capacitance of the adjustable capacitor 110 upwards or downwards depending on whether the sampled voltage on the voltage supply node 101 is respectively less than a specified voltage or greater than a specified voltage. Further, frequent automatic capacitance adjustment allows the voltage supply circuit 100 to continue to accurately generate the specified voltage on the voltage supply node 101, continually compensating for changes such as aging of the components in the voltage supply circuit 100, operating temperature changes, or other sudden or gradual environmental changes. Furthermore, trimming of the capacitance of the adjustable capacitor 110 to account for device-to-device manufacturing deviations or defects may be avoided, since the adjustable capacitor 110 will be adjusted in normal operation.

Figure 2:
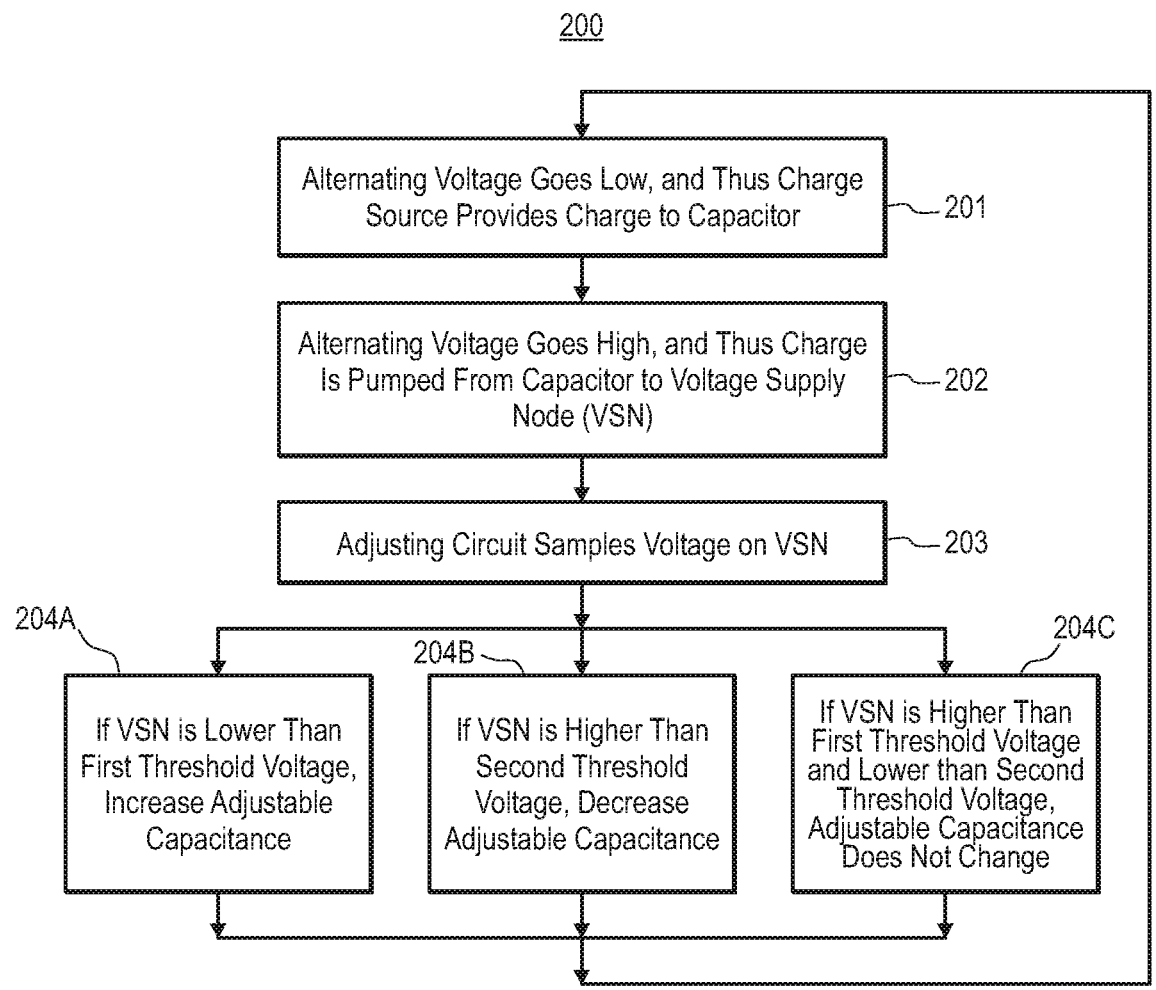
FIG. 2 illustrates a flowchart of a method that describes an example of the operation of the voltage supply circuit of FIG. 1 during a single period of the alternating voltage.

FIG. 2 illustrates a flowchart of a method 200 that describes an example of the operation of the voltage supply circuit 100 of FIG. 1 during a single period of the alternating voltage. For example, the period of the alternating voltage begins when the alternating voltage transitions low (act 201 in FIG. 2). When the alternating voltage transitions low, the voltage on the first capacitor terminal 111 also becomes low, and the charge source 130 provides charge to the first capacitor terminal 111 of the adjustable capacitor (also act 201). The alternating voltage thereafter transitions high, and thus the voltage on the first capacitor terminal 111 also becomes high, and charge is thereby pumped from the first capacitor terminal 111 to the voltage supply node 101 (act 202). In FIG. 2, the voltage supply node 101 may be referred to as "VSN" for brevity.

As previously expressed, the adjusting circuit 140 periodically samples the voltage on the voltage supply node 101. For example, in the method 200 of FIG. 2, the adjusting circuit 140 samples the voltage on the voltage supply node 101 a single time during each period of the alternating voltage after the alternating voltage has transitioned high (act 203). However, the principles described herein are not limited to the frequency with which the adjusting circuit 140 samples the voltage on the voltage supply node 101, and are not limited to the particular moment during the period of the alternating voltage that the adjusting circuit 140 samples the voltage supply node 101. That being said, for purposes of explanation, assume that the adjusting circuit 140 samples the voltage on the voltage supply node 101 a single time during each period of the alternating voltage, and that the sampling occurs just after the alternating voltage transitions high.

If, when the adjusting circuit 140 samples the voltage supply node 101, the voltage on the voltage supply node 101 is lower than a first threshold voltage, the adjusting circuit 140 increases the adjustable capacitance of the adjustable capacitor 110 (act 204A). As an example, the voltage supply circuit 100 may be calibrated so that the specified voltage to be generated on the voltage supply node is 8 volts, and the first threshold voltage is 7.8 volts. In this case, if the adjusting circuit 140 sampled that the voltage on the voltage supply node 101 was less than 7.8 volts, the adjusting circuit 140 would increase the adjustable capacitance of the adjustable capacitor 110 so that slightly more charge would be pumped from the first capacitor terminal 111 to the voltage supply node 101 during the next period of the alternating voltage.

On the other hand, if when the adjusting circuit 140 samples the voltage supply node, the voltage on the voltage supply node 101 is higher than a second threshold voltage, the adjusting circuit 140 decreases the adjustable capacitance of the adjustable capacitor 110 (act 204B). As an example, if the voltage supply circuit 100 is calibrated so that the specified voltage to be generated on the voltage supply node is 8 volts, the second threshold voltage might be 8.2 volts. In this case, if the adjusting circuit 140 sampled that the voltage on the voltage supply node 101 was more than 8.2 volts, the adjusting circuit 140 would decrease the adjustable capacitance of the adjustable capacitor 110 so that slightly less charge would be pumped from the first capacitor terminal 111 to the voltage supply node 101 during the next period of the alternating voltage.

Finally, if when the adjusting circuit 140 samples the voltage supply node 101, the voltage on the voltage supply node 101 is higher than the first threshold voltage, but lower than the second threshold voltage, the adjusting circuit 140 perhaps does not change the adjustable capacitance of the adjustable capacitor 110 (act 204C). For example, if the voltage supply circuit 100 is calibrated so that the specified voltage to be generated on the voltage supply node 101 is 8 volts, the first threshold voltage may be 7.8 volts, and the second threshold voltage may be 8.2 volts. In this case, if the adjusting circuit 140 sampled that the voltage on the voltage supply node 101 was more than 7.8 volts, but less than 8.2 volts, the adjusting circuit 140 would not change the adjustable capacitance of the adjustable capacitor 110.

Accordingly, the actual voltage generated on the voltage supply node 101 may be kept at approximately the specified voltage, within a range between the first threshold voltage and the second threshold voltage. To maintain the actual voltage generated on the voltage supply node 101 more closely to the specified voltage, values of the first threshold voltage and the second threshold voltage could be chosen that are closer to the specified voltage. For example, if the specified voltage is 8 volts, the first threshold voltage could be 7.95 volts, and the second threshold voltage could be 8.05 volts. To bring this concept further, the first and second threshold voltages could actually even be the same as each other and equal to the specified voltage. For instance, if the specified voltage was 8 volts, if the adjusting circuit 140 detects a voltage above 8 volts, the adjustable capacitance is adjusted downwards; and if the adjusting circuit 140 detects a voltage below 8 volts, the adjustable capacitance is adjusted upwards.

The adjustable capacitance of the adjustable capacitor 110 is able to be increased and/or decreased in small increments.

Figure 3:
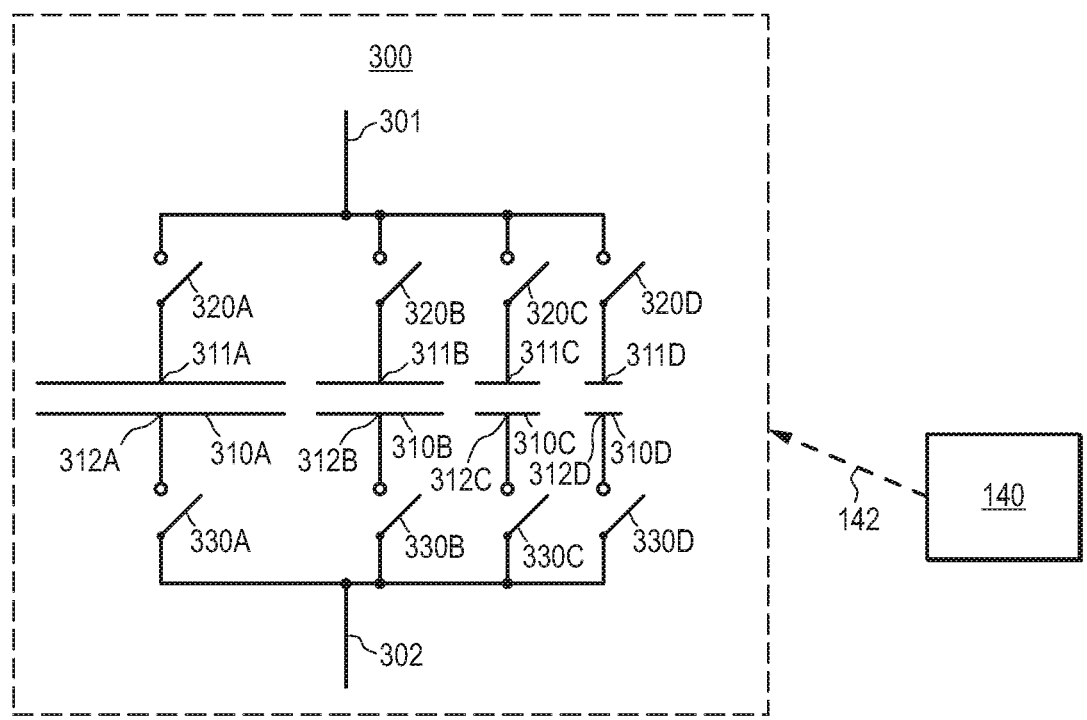
FIG. 3 illustrates an adjustable capacitor bank that is an example of the adjustable capacitor of FIG. 1.

As an example only, this could be accomplished by having the adjustable capacitor 110 comprise a capacitor bank of various sizes of capacitors. FIG. 3 illustrates such an example.

FIG. 3 illustrates an adjustable capacitor bank 300 that is an example of the adjustable capacitor 110 of FIG. 1. Specifically, the adjustable capacitor bank 300 includes four fixed capacitors—capacitors 310A, 310B, 310C and 310D—connected in parallel with each other. However, the principles described herein are not limited to the number of capacitors contained within the capacitor bank 300, and are not limited to the capacitors contained within the capacitor bank 300 themselves being fixed capacitors.

The capacitors 310A through 310D include respective upper terminals 311A through 311D that are selectively couplable to a first capacitor bank terminal 301 via switches 320A through 320D. The first capacitor bank terminal 301 is an example of the first capacitor terminal 111 of FIG. 1. The capacitors 310A through 310D also include respective lower terminals 312A through 312D that are selectively couplable to a second capacitor bank terminal 302 via switches 330A through 330D. The second capacitor bank terminal 302 is an example of the second capacitor terminal 112 of FIG. 1.

As illustrated in FIG. 3, the capacitors 310A through 310D may be different sizes, and thus may have capacitive values that differ from each other. As an example, suppose that each subsequent capacitor of the capacitors 310A through 310D were sized in binary proportion. For example, if the largest capacitor 310A had a capacitance of 8×Z (8 times some number Z) Farads, then the capacitor 310B would have a capacitance of 4×Z Farads, the capacitor 310C would have a capacitance of 2×Z Farads, and the smallest capacitor 310D would have a capacitance of just Z Farads. The total capacitance of the adjustable capacitor bank 300 would be the sum of the capacitances of whichever of the capacitors 310A through 310D were actually coupled to the first capacitor bank terminal 301 and the second capacitor bank terminal 302.

In the case of the capacitors 310A through 310D being sized in binary proportion, a binary sequence may be used to drive the adjustable capacitor bank 300 such that each bit of the binary sequence defines whether the respective switches of a capacitor are open or closed. In fact, the binary sequence may be regarded as a binary value, where the most significant bit is used to drive the switches 320A and 330A of the largest capacitor 310A, the next most significant bit is used to drive the switches 320B and 330B of the next largest capacitor 310B, the next most significant bit is used to drive the switches 320C and 330C of the next largest capacitor 310C, and the least significant bit is used to drive the switches 320D and 330D of the smallest capacitor 310D. Thus, a binary value of 1111 (which is 15 in base 10) is used to adjust the adjustable capacitor bank 300 to have a capacitance of 15×Z Farads, and a binary value of 0001 (which is 1 in base 10) is used to adjust the adjustable capacitor bank 300 to have a capacitance of merely Z Farads.

More generally stated, the binary value will cause the adjustable capacitor bank 300 to have a capacitance of S×Z Farads, where S is the binary value of the binary sequence represented in base 10 (and recall that Z represents the capacitance in Farads of the smallest capacitor 310D). However, the principles described herein are not limited to a particular language or protocol the adjusting circuit 140 uses to send instructions to the adjustable capacitor bank 300. Furthermore, there may be more (or less) than four capacitors sized in binary proportion that receive instruction in the form of a binary sequence having more (or less) than four bits. Of course, the principles described herein are not limited to how the adjustable capacitor 110 of FIG. 1 is structured.

Further, the adjustable capacitor bank 300 may optionally include one or more additional fixed capacitors that may be connected directly to the first and second capacitor bank terminals 301 and 302, such that those particular fixed capacitor(s) may provide at least some minimum amount of capacitance "Y" of the adjustable capacitor bank 300. Thus, the binary sequence (having value S in base 10) could be used such that the adjustable capacitor has a total capacitance of Y+S×Z.

In the example in which the adjustable capacitor 110 includes the adjustable capacitor bank 300, if the sampled voltage of the supply node 101 is lower than a first threshold voltage, the adjusting circuit 140 may increment the binary sequence by one in order to increase the capacitance of the adjustable capacitor bank 300, and thereby increase the voltage on the voltage supply node 101. For instance, if the binary sequence was 0101 (to provide a capacitance of 5×Z Farads), the binary sequence would be incremented to 0110 (to provide an increased capacitance of 6×Z Farads). On the other hand, if the sampled voltage of the supply node 101 is higher than a second threshold voltage, the adjusting circuit 140 may decrement the binary sequence by one in order to decrease the capacitance of the adjustable capacitor bank 300, and thereby decrease the voltage on the voltage supply node 101. For instance, if the binary sequence was 0110 (to provide a capacitance of 6×Z Farads), the binary sequence would be decremented to 0101 (to provide a decreased capacitance of 5×Z Farads).

In one embodiment, if the voltage on the voltage supply node 101 was significantly lower than a first threshold voltage, or significantly higher than a second threshold voltage, the adjusting circuit 140 may respectively increment (or decrement) the binary sequence by more than one so as to more quickly increase (or decrease) the adjustable capacitance of the adjustable capacitor bank 300, and thereby more quickly correct the voltage on the voltage supply node 101. In the case in which a binary sequence is used to adjust the capacitance, the principles described herein are not limited to the particular number by which the adjusting circuit 140 increments and/or decrements the binary sequence.

Figure 4:
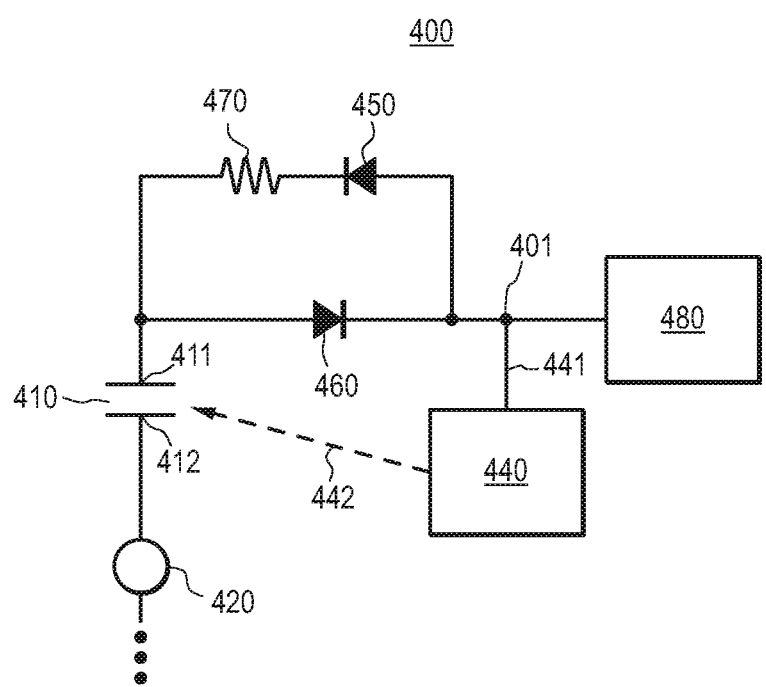
FIG. 4 illustrates a voltage supply circuit, which is an example of the voltage supply circuit of FIG. 1.

FIG. 4 illustrates a voltage supply circuit 400, which is an example of the voltage supply circuit 100 of FIG. 1. Specifically, the voltage supply node 401, the adjustable capacitor 410, the first capacitor terminal 411, the second capacitor terminal 412, the alternating voltage supply 420, and the adjusting circuit 440 of FIG. 4 are respective examples of the voltage supply node 101, the adjustable capacitor 110, the first capacitor terminal 111, the second capacitor terminal 112, the alternating voltage source 120, and the adjusting circuit 140 of FIG. 1. Further, similar to FIG. 1, line 441 represents that the adjusting circuit 440 samples the voltage on the voltage supply node 401, and dashed arrow 442 represents that the adjusting circuit 440 controls the adjustable capacitance of the adjustable capacitor 410. However, the voltage supply circuit 400 further includes diodes 450 and 460, a resistor 470, and a load 480.

In FIG. 4, the voltage supply node 401 acts as an example of both the voltage supply node 101 of FIG. 1 and the charge source 130 of FIG. 1. The diode 450 and the resistor 470 connected in series act as example intervening circuit elements between the voltage supply node 401 (which is an example of the charge source 130 of FIG. 1) and the first capacitor terminal 411 (which is an example of the first capacitor terminal 111 of FIG. 1). Thus, in FIG. 4, the voltage supply node 401 is coupled to the first capacitor terminal 411 in that the intervening circuit elements allow current to flow from the voltage supply node 401 to the first capacitor terminal 411 so long as the voltage on the voltage supply node 401 is more than a threshold voltage of the diode 450 above the voltage on the first capacitor terminal 411. Accordingly, when the alternating voltage provided by the alternating voltage supply 420 decreases from a high voltage to a low voltage, a corresponding decrease in voltage on the first capacitor terminal 411 is induced (that is at least the diode threshold voltage of the diode 450 below the voltage on the voltage supply node 401), and charge from the voltage supply node 401 is forced through the diode 450 and the resistor 470 to the first capacitor terminal 411.

Further, the diode 460 is an example intervening circuit element between the first capacitor terminal 411 (which is an example of the first capacitor terminal 111 of FIG. 1) and the voltage supply node 401 (now acting as an example of the voltage supply node 101 of FIG. 1). Thus, in FIG. 4, the first capacitor terminal 411 is coupled to the voltage supply node 401 in that the intervening diode 460 allows current to flow from the first capacitor terminal 411 to the voltage supply node 401 so long as the voltage on the first capacitor terminal 411 is more than a threshold voltage of the diode 460 above the voltage on the voltage supply node 401. Accordingly, when the alternating voltage provided by the alternating voltage supply 420 increases from a low voltage to a high voltage, a corresponding increase in voltage on the first capacitor terminal 411 is induced (that is at least the diode threshold voltage of the diode 460 above the voltage on the voltage supply node 401), and charge from the first capacitor terminal 411 is forced through the diode 460 to the voltage supply node 401.

In one embodiment, the load 480 is a switching load (e.g., a load that uses AC power) that alternates between a fast draw state in which the load 480 quickly draws charge from the voltage supply node 401, and a slow draw state in which the load 480 more slowly draws charge from the voltage supply node 401. The load 480 alternates between the fast draw state and the slow draw state with a certain frequency. In one embodiment, the alternating voltage provided by the alternating voltage supply 420 may also alternate between its higher voltage and its lower voltage with the same frequency as the load 480, and such that the alternating voltage is transitioning high at about the time that the load 480 enters its fast draw state. This allows the pushing of charge to the voltage supply node 401 just when the charge is to be used by the load 480, thus matching the demand of the switching load 480. This protects against depletion of voltage on the voltage supply node 401 in the context of providing charge to a switching load.

As previously expressed, the adjusting circuit 440 periodically samples the voltage on the voltage supply node 401, and may increase or decrease the adjustable capacitance of the adjustable capacitor 410 in order to respectively increase or decrease the voltage on the voltage supply node 401. Accordingly, the voltage supply circuit 400 is capable of accurately generating a specified voltage (or otherwise carefully controlling the voltage) on the voltage supply node 401 by adjusting the capacitance of the adjustable capacitor 410 upwards or downwards depending on whether the sampled voltage on the voltage supply node 401 is respectively less than a specified voltage or greater than a specified voltage. This further allows for the voltage supply circuit 400 to continually compensate for changes in an amount of charge drawn by the load 480 per period of the alternating voltage. Furthermore, in the case of a switching load, the fast draw state may be aligned more closely with the period in which the alternating voltage is high such that charge is both being provided to the voltage supply node 401 whilst the highest rate of charge is being drawn from the voltage supply node 401.

Figure 5:
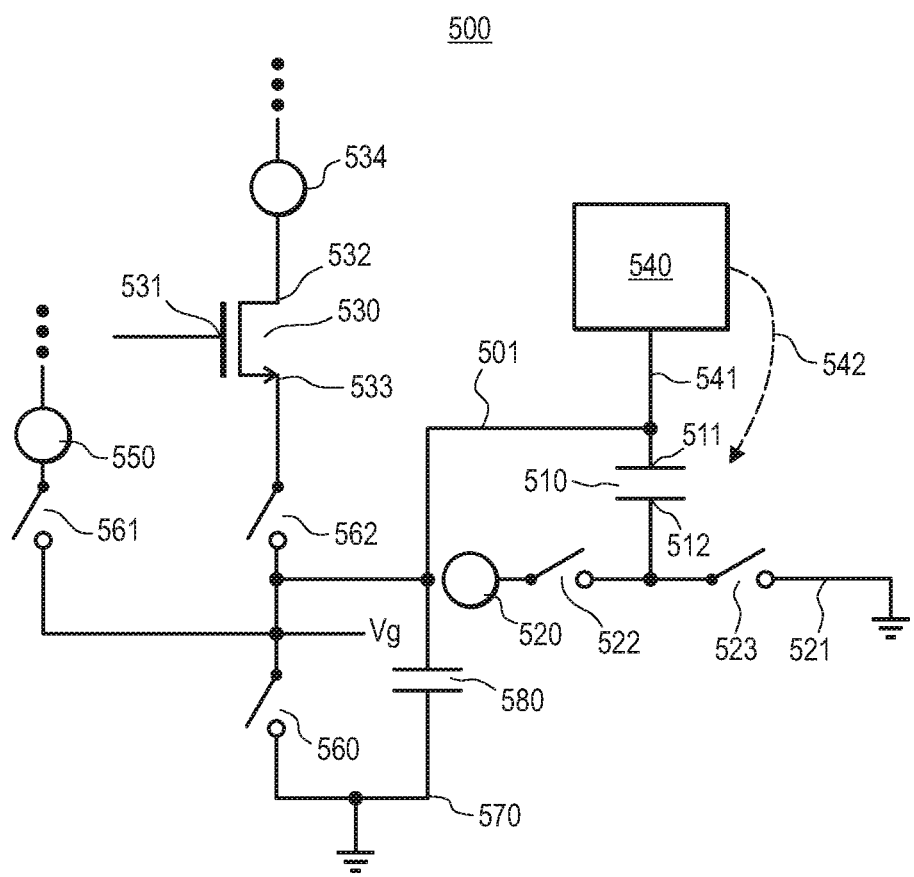
FIG. 5 illustrates a voltage supply circuit, which is an example of the voltage supply circuit of FIG. 1, and the voltage supply circuit of FIG. 4.

FIG. 5 illustrates a voltage supply circuit 500, which is an example of the voltage supply circuit 100 of FIG. 1. Specifically, the voltage supply node 501, the adjustable capacitor 510, the first capacitor terminal 511, the second capacitor terminal 512, and the adjusting circuit 540 of FIG. 5 are respective examples of the voltage supply node 101, the adjustable capacitor 110, the first capacitor terminal 111, the second capacitor terminal 112, and the adjusting circuit 140 of FIG. 1. Further, similar to FIG. 1, line 541 represents that the adjusting circuit 540 samples the voltage on the voltage supply node 501, and dashed arrow 542 represents that the adjusting circuit 540 controls the adjustable capacitance of the adjustable capacitor 510.

In FIG. 5, the voltage on the control node 501 may be used to cause a power transistor (not shown) to switch on and off. For example, suppose that the power transistor is an enhancement mode field-effect transistor (in which case the control node 501 is connected to the gate terminal of the field-effect transistor). In that case, the power transistor may be turned off by applying 0 volts to the control node 501, and turned on by applying 6 volts to the control node 501. In one embodiment, a voltage is generated on the voltage supply node 501 in order to turn on the power transistor even more than normal by applying a higher overdrive voltage to the control node 501. For instance, an overdrive voltage of 8 volts may be provided on the voltage supply node 501 when entering overdrive mode.

The voltage supply circuit 500 further includes a voltage source 520, a voltage source 521, and two switches 522 and 523 that collectively act as an example of the alternating voltage source 120 of FIG. 1. For example, when the switch 522 is closed and the switch 523 is open, a higher voltage (e.g., 6 volts) is applied to the second capacitor terminal 512. On the other hand, when the switch 523 is closed and the switch 522 is open, a lower voltage (e.g., ground) is applied to the second capacitor terminal 512. Thus, an alternating voltage may be applied to the second capacitor terminal 512 by, for each cycle, controlling the switches 522 and 523 to apply a high voltage, and then controlling the switches 522 and 523 again to apply a low voltage.

The voltage supply circuit 500 further includes a field-effect transistor 530 having a gate terminal 531 that controls whether current flows between a drain terminal 532 and a source terminal 533. The drain terminal 532 is connected to a high voltage source 534, which provides, for example, a much higher voltage (e.g., hundreds of volts) to the drain terminal 532. The field-effect transistor 530 and the high voltage source 534 collectively act as an example of the charge source 130 of FIG. 1. The source terminal 533 is switchably connected to the voltage supply node 501 via a switch 562.

As an example, suppose that the voltage supply circuit 500 is structured so as to generate an internal voltage source of 8 volts on the voltage supply node 501. This might be helpful, for example, to internally generate an overdrive voltage for a power transistor (not shown). In that case, the field-effect transistor 530 is on when the voltage at the gate terminal 531 is at least 8 volts plus some threshold voltage (e.g., the gate-to-source threshold voltage of the field-effect transistor 530). Accordingly, for purposes of explanation, assume that the gate terminal 531 is always supplied with 8 volts plus the threshold voltage, such that when the voltage on the voltage supply node 501 becomes less than 8 volts (and the switch 562 is closed), the field-effect transistor 530 turns on, and thus charge is supplied from the high voltage source 534 to the voltage supply node 501 via the field-effect transistor 530 and switch 562.

The voltage supply circuit 500 further includes a voltage source 550, a voltage source 570, and a small fixed capacitor 580. As an example, the voltage source 550 may provide 6 volts, and the voltage source 570 may be ground. The control node 502 is selectively couplable to the voltage source 570 via a switch 560, is selectively couplable to the voltage source 550 via a switch 561, and is selectively couplable to the voltage supply node 501 via a switch 562.

To provide zero volts to the control node 501 (e.g., to turn off a power transistor), the switches 561 and 562 would be open, while switch 560 is closed, thus connecting the control node 502 to the ground provided by the voltage source 570. The voltage source 570 will also be referred to as the "off voltage source". To provide 6 volts to the control node 501 (e.g., to turn on the power transistor normally), the switches 560 and 562 would be open, while switch 561 is closed, thus connecting the control node 501 to the voltage source 550 that provides 6 volts. The voltage source 550 will also be referred to as the "normal on voltage source". When the power transistor is off or normally on, the second capacitor terminal 512 is connected to zero volts via the switch 523. Also, in these states, the capacitor 510 has been charged to have a voltage difference of 6 volts for reasons previously described. The off voltage source 550 and the voltage source 520 may both be provided by external pins or the like, from which charge is readily available. Thus, the power transistor may be readily turned on and off.

Once the power transistor is normally on (e.g., by the application of 6 volts to the control node 502), the power transistor may be turned on more by overdriving the transistor. Overdriving the power transistor is accomplished by providing the overdrive voltage (such as 8 volts) to the control node 502 by turning off switch 561 and turning on switch 562. However, the collective capacitance of the voltage supply node 501 is more limited. Accordingly, when overdriving of the power transistor is to occur, to ensure that sufficient charge is provided to the voltage supply node from the capacitor 510, overdriving is initiated by opening switch 523 and closing switches 522. This causes the voltage at the second capacitor terminal 512 to increase from ground to 6 volts, causing charge to flow into the control node 501 to help quickly equalize the voltage at node 502 to the desired overdrive voltage.

However, the equalized voltage will depend on the relative size of the capacitance of the capacitor 510 and the capacitance of the gate terminal of the power transistor connected to the control node 501. The principles described herein adjust the capacitance of the adjustable capacitor 510 so that this equalized voltage is a suitable voltage for overdriving the power transistor.

The adjusting circuit 540 is capable of periodically and/or continually sampling the control node 501. If the adjusting circuit 540 samples that the gate voltage $V_g$ on the control node 501 is not quite being boosted up to 8 volts when the control node 501, the adjusting circuit 540 may increase the capacitance of the adjustable capacitor 510, such that more charge will be provided to the voltage supply node 501. On the other hand, if the adjusting circuit 540 samples that the gate voltage $V_g$ on the control node 501 is being boosted up to slightly above 8 volts (which could possibly damage the power transistor), the adjusting circuit 540 may decrease the capacitance of the adjustable capacitor 510, such that less charge will be provided to the voltage supply node 501 from the first capacitor terminal 511. Accordingly, the voltage supply circuit 500 allows for precise control of a gate voltage $V_g$ provided to the control node 501, particularly while the control node 501 is being provided with a voltage from the voltage supply node 501.

Figure 6:
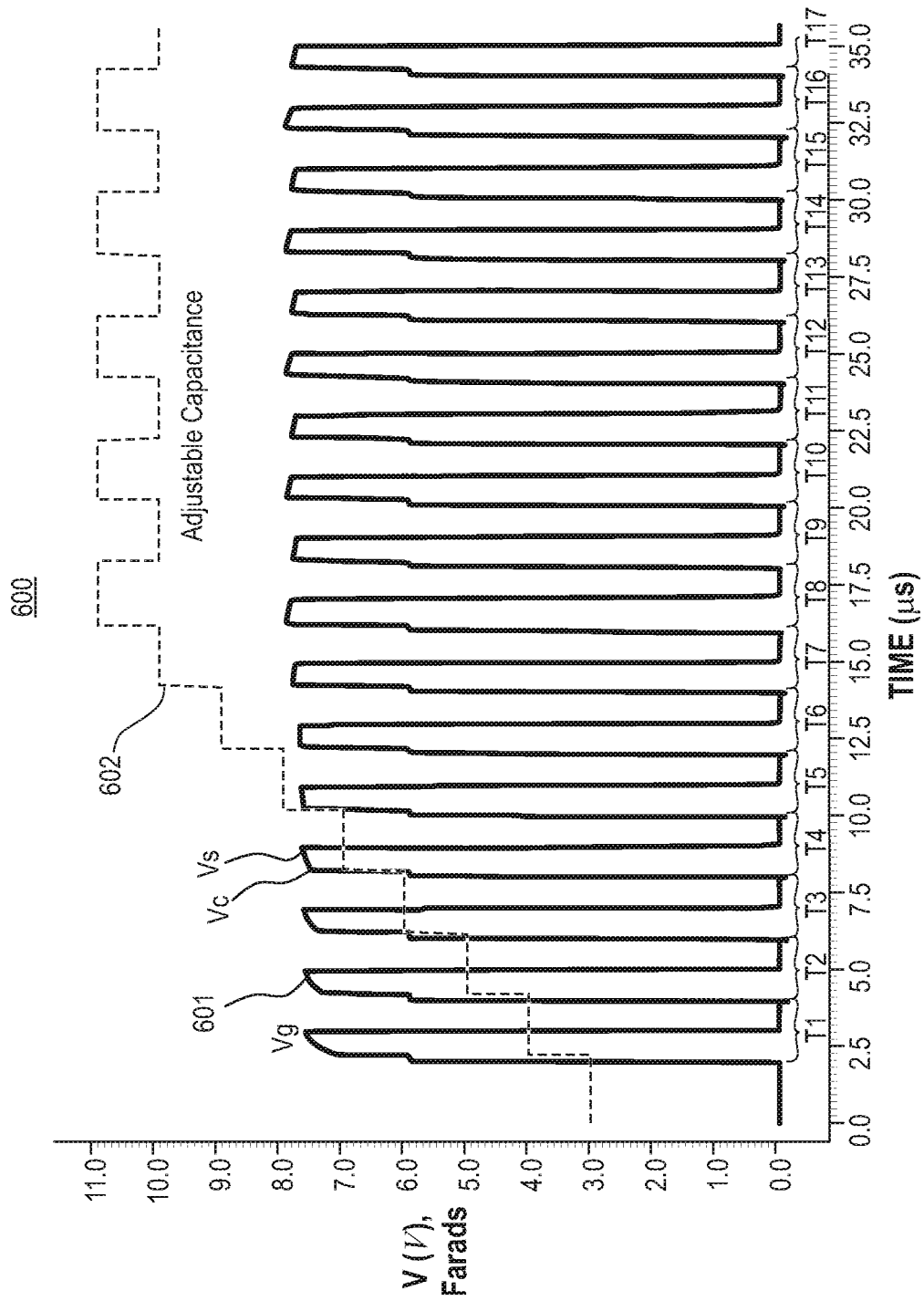
FIG. 6 illustrates a signal diagrams chart that shows an example simulation of the voltage supply circuit of FIG. 5 repeatedly alternating through connecting the control node to different voltage sources, including the internally generated voltage source.

As an example of the sampling and capacitance adjustment that the adjusting circuit 540 performs, FIG. 6 illustrates a signal diagrams chart 600 that shows an example simulation of the voltage supply circuit 500 repeatedly alternating through connecting the control node 502 to the grounded voltage source 570, the 6-volt voltage source 550, and the 8-volt voltage supply node 501. Further, the signal diagrams chart 600 shows an example timeline 601 (solid line) of the sampled gate voltage $V_g$ overlayed with an example timeline 602 (dashed line) of the adjustable capacitance value of the adjustable capacitor 510, each of which are provided merely by way of example. The horizontal axis represents time passing from left to right in microseconds, where the same horizontal position in each of the timelines 601 and 602 represents the same time. The vertical axis for the timeline 601 represents the sampled gate voltage $V_g$ in volts on the control node 502, and the vertical axis for the timeline 602 represents the adjustable capacitance value in Farads of the adjustable capacitor 510 in base 10.

The timeline 601 of the gate voltage $V_g$ is divided up into periods T1 through T17. Each of the periods T1 through T17 begins at the start of a rising edge of the gate voltage $V_g$, and ends just before the start of the next rising edge. As illustrated in FIG. 6, in each of the periods T1 through T17, the gate voltage $V_g$ first sharply increases from ground to 6 volts. The gate voltage $V_g$ then sharply increases from 6 volts to some sample voltage $V_C$ (labelled only on time period T4 for simplicity). The sample voltage $V_C$ is called the "sample voltage" because that voltage is what is sampled by the adjusting circuit 540. By increasing the adjustable capacitance of the adjustable capacitor 510, the voltage on the voltage supply node 501 is boosted higher, and thus the sample voltage $V_C$ is increased. On the other hand, by decreasing the adjustable capacitance of the adjustable capacitor 510, the voltage on the voltage supply node 501 is not boosted as much, and thus the sample voltage $V_C$ is decreased. In time periods T1 through T7, this sample voltage $V_C$ is above 6 volts, but below 8 volts. On the other hand, in time periods T8 through T17, this sample voltage $V_C$ alternates between being above and being below 8 volts.

In any case, when the adjusting circuit 540 samples the sample voltage $V_C$ (e.g., during each period T1 through T17 in the case of FIG. 6), if the sample voltage $V_C$ is less than 8 volts, the adjusting circuit 540 increments the value of the adjustable capacitor 510 by one for the next period. As an example, for period T4, the adjusting circuit 540 samples that the sample voltage $V_C$ is less than 8 volts, and so the adjusting circuit 540 increments the adjustable capacitance of the adjustable capacitor 510 from 7×Z Farads to 8×Z Farads for the subsequent period T5. On the other hand, when the adjusting circuit 540 samples the sample voltage $V_C$, if the sample voltage $V_C$ is more than 8 volts, the adjusting circuit 540 decrements the value of the adjustable capacitor 510 by one for the next period. For example, for period T8, the adjusting circuit 540 samples that the sample voltage $V_C$ is more than 8 volts, and so the adjusting circuit 540 decrements the adjustable capacitance of the adjustable capacitor 510 from 11×Z Farads to 10×Z Farads for the subsequent period T9.

In FIG. 6, the first threshold voltage and the second threshold voltage are each equal to the specified voltage (which is 8 volts). Accordingly, from time periods T8 to T17, the adjusting circuit 540 alternately increments and decrements the adjustable capacitance of the adjustable capacitor 510 such that the sample voltage $V_C$ remains approximately (just above and just below) the specified voltage.

Accordingly, the voltage supply circuit 600 is capable of accurately generating a specified voltage (or otherwise carefully controlling the voltage) on the voltage supply node 501 by adjusting the capacitance of the adjustable capacitor 510 upwards or downwards depending on whether the sampled voltage on the voltage supply node 501 is respectively less than a specified voltage or greater than a specified voltage. Thus, the voltage supply circuit 600 is further capable of providing a precise overdrive sample voltage $V_C$ on the control node 501. Further, frequent automatic capacitance adjustment allows the voltage supply circuit 600 to continue to accurately generate the specified voltage on the voltage supply node 501 (thereby providing a precise overdrive sample voltage $V_C$ on the control node 502), continually compensating for changes such as aging of the components in the voltage supply circuit 600, operating temperature changes, or other sudden or gradual environmental changes. Furthermore, trimming of the capacitance of the adjustable capacitor 510 to account for device-to-device manufacturing deviations or defects may be avoided, since the capacitance will be adjusted in normal operation.

Literal Support Section

Clause 1. A voltage supply circuit that is configured to generate a voltage on a voltage supply node, the voltage supply circuit comprising: a charge source; an alternating voltage source configured to provide an alternating voltage that alternates between a first voltage and a second voltage; and an adjustable capacitor having an adjustable capacitance and comprising a first capacitor terminal coupled to the voltage supply node and to the charge source, and having a second capacitor terminal connected to the alternating voltage source to as to receive the alternating voltage from the alternating voltage source; wherein when the alternating voltage on the second capacitor terminal transitions low, the voltage on the first capacitor terminal also becomes low, and the charge source provides charge to the first capacitor terminal of the adjustable capacitor; and when the alternating voltage on the second capacitor terminal transitions high, the voltage on the first capacitor terminal also becomes high, and charge is thereby pumped from the first capacitor terminal to the voltage supply node.

Clause 2. The voltage supply circuit according to Clause 1, the voltage supply circuit further comprising an adjusting circuit configured to periodically adjust the adjustable capacitance in response to periodically sampling the voltage on the voltage supply node, wherein when the adjusting circuit determines that a voltage on the voltage supply node is lower than a first threshold voltage, the adjusting circuit adjusts upwards the adjustable capacitance of the adjustable capacitor, and when the adjusting circuit determines that a voltage on the voltage supply node is higher than a second threshold voltage, the adjusting circuit adjusts downwards the adjustable capacitance of the adjustable capacitor.

Clause 3. The voltage supply circuit according to Clause 2, the first threshold voltage and the second threshold voltage being a same threshold voltage.

Clause 4. The voltage supply circuit according to Clause 2, the second threshold voltage being higher than the first threshold voltage.

Clause 5. The voltage supply circuit according to Clause 4, wherein when the adjusting circuit determines that a voltage on the voltage supply node is higher than a first threshold voltage and lower than the second threshold voltage, the adjusting circuit does not change the adjustable capacitance of the adjustable capacitor.

Clause 6. The voltage supply circuit according to Clause 1, further comprising: a set of binary capacitors sized in binary proportions; and a set of switches, each switch connecting or disconnecting a corresponding binary capacitor of the set of binary capacitors such that a set of connected binary capacitors forms the adjustable capacitor, and such that adjustment of the adjustable capacitance of the adjustable capacitor is performed by selecting binary capacitor to connect, and connected the selected binary capacitors.

Clause 7. The voltage supply circuit according to Clause 6, the adjusting circuit configured to adjust the adjustable capacitance by generating a binary code and providing a respective bit of the binary code to each of switches of the set of switches.

Clause 8. The voltage supply circuit according to Clause 1, the charge source being the voltage supply node connected to a switching load.

Clause 9. The voltage supply circuit according to Clause 8, the charge source configured to provide charge to the first capacitor terminal of the adjustable capacitor through a series connection of a diode and a resistor.

Clause 10. The voltage supply circuit according to Clause 9, wherein when the alternating voltage decreases from the second voltage to the first voltage on the second capacitor terminal of the adjustable capacitor, a corresponding voltage decreases on the voltage supply node is induced by forcing charge from the voltage supply node through the diode and resistor and to the first capacitor terminal.

Clause 11. The voltage supply circuit according to Clause 10, the diode being a first diode, wherein when the alternating voltage increases from the first voltage to the second voltage on the second capacitor terminal of the adjustable capacitor, a corresponding voltage increase on the voltage supply node is induced by forcing charge from the first capacitor terminal through a second diode to the voltage supply node.

Clause 12. The voltage supply circuit according to Clause 9, the diode being a first diode, wherein when the alternating voltage increases from the first voltage to the second voltage on the second capacitor terminal of the adjustable capacitor, a corresponding voltage increase on the voltage supply node is induced by forcing charge from the first capacitor terminal through a second diode to the voltage supply node.

Clause 13. The voltage supply circuit according to Clause 1, the charge source configured to supply charge to the first capacitor terminal when the voltage of the first capacitor terminal drops below a reference voltage, but configured to not supply charge to the first capacitor terminal when the voltage is above the reference voltage.

Clause 14. The voltage supply circuit according to Clause 13, the charge source comprising a field-effect transistor having a gate-source threshold voltage, a source terminal of the field-effect transistor connected to the first capacitor terminal, a drain terminal connected to a voltage source that provides a voltage greater than the reference voltage, and a gate terminal that is biased at the reference voltage plus the gate-source threshold voltage.

Clause 15. The voltage supply circuit according to Clause 13, wherein when the alternating voltage increases from the first voltage to the second voltage on the second capacitor terminal of the adjustable capacitor, a corresponding voltage increase on the voltage supply node is induced, and the voltage supply node is connected to a gate terminal of a power transistor.

Clause 16. The voltage supply circuit according to Clause 15, wherein when the alternating voltage increases from the first voltage to the second voltage on the second capacitor terminal of the adjustable capacitor, a corresponding voltage increase on the voltage supply node is induced, and the voltage supply node is connected to a gate terminal of a power transistor.

Clause 17. The voltage supply circuit according to Clause 1, further comprising: a fixed capacitance capacitor connected between a fixed voltage source and the voltage supply node.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A voltage supply circuit that is configured to generate a voltage on a voltage supply node, the voltage supply circuit comprising:
    a charge source;
    an alternating voltage source configured to provide an alternating voltage that alternates between a first voltage and a second voltage; and
    an adjustable capacitor having an adjustable capacitance and comprising a first capacitor terminal coupled to the voltage supply node and to the charge source, and having a second capacitor terminal connected to the alternating voltage source to as to receive the alternating voltage from the alternating voltage source; wherein
    when the alternating voltage on the second capacitor terminal transitions low, the voltage on the first capacitor terminal also becomes low, and the charge source provides charge to the first capacitor terminal of the adjustable capacitor; and
    when the alternating voltage on the second capacitor terminal transitions high, the voltage on the first capacitor terminal also becomes high, and charge is thereby pumped from the first capacitor terminal to the voltage supply node,
    the charge source configured to supply charge to the first capacitor terminal when the voltage of the first capacitor terminal drops below a reference voltage, but configured to not supply charge to the first capacitor terminal when the voltage is above the reference voltage,
    the charge source comprising a field-effect transistor having a gate-source threshold voltage, a source terminal of the field-effect transistor connected to the first capacitor terminal, a drain terminal connected to a voltage source that provides a voltage greater than the reference voltage, and a gate terminal that is biased at the reference voltage plus the gate-source threshold voltage.

2. The voltage supply circuit according to claim 1, the voltage supply circuit further comprising an adjusting circuit configured to periodically adjust the adjustable capacitance in response to periodically sampling the voltage on the voltage supply node, wherein
    when the adjusting circuit determines that a voltage on the voltage supply node is lower than a first threshold voltage, the adjusting circuit adjusts upwards the adjustable capacitance of the adjustable capacitor, and
    when the adjusting circuit determines that a voltage on the voltage supply node is higher than a second threshold voltage, the adjusting circuit adjusts downwards the adjustable capacitance of the adjustable capacitor.

3. The voltage supply circuit according to claim 2, the first threshold voltage and the second threshold voltage being a same threshold voltage.

4. The voltage supply circuit according to claim 2, the second threshold voltage being higher than the first threshold voltage.

5. The voltage supply circuit according to claim 4, wherein
    when the adjusting circuit determines that a voltage on the voltage supply node is higher than a first threshold voltage and lower than the second threshold voltage, the adjusting circuit does not change the adjustable capacitance of the adjustable capacitor.

6. The voltage supply circuit according to claim 1, further comprising:
    a set of binary capacitors sized in binary proportions; and
    a set of switches, each switch connecting or disconnecting a corresponding binary capacitor of the set of binary capacitors such that a set of connected binary capacitors forms the adjustable capacitor, and such that adjustment of the adjustable capacitance of the adjustable capacitor is performed by selecting binary capacitor to connect, and connected the selected binary capacitors.

7. The voltage supply circuit according to claim 6, the adjusting circuit configured to adjust the adjustable capacitance by generating a binary code and providing a respective bit of the binary code to each of switches of the set of switches.

8. The voltage supply circuit according to claim 1, the charge source being the voltage supply node connected to a switching load.

9. The voltage supply circuit according to claim 8, the charge source configured to provide charge to the first capacitor terminal of the adjustable capacitor through a series connection of a diode and a resistor.

10. The voltage supply circuit according to claim 9, wherein when the alternating voltage decreases from the second voltage to the first voltage on the second capacitor terminal of the adjustable capacitor, a corresponding voltage decreases on the voltage supply node is induced by forcing charge from the voltage supply node through the diode and resistor and to the first capacitor terminal.

11. The voltage supply circuit according to claim 10, the diode being a first diode, wherein when the alternating voltage increases from the first voltage to the second voltage on the second capacitor terminal of the adjustable capacitor, a corresponding voltage increase on the voltage supply node is induced by forcing charge from the first capacitor terminal through a second diode to the voltage supply node.

12. The voltage supply circuit according to claim 9, the diode being a first diode, wherein when the alternating voltage increases from the first voltage to the second voltage on the second capacitor terminal of the adjustable capacitor, a corresponding voltage increase on the voltage supply node is induced by forcing charge from the first capacitor terminal through a second diode to the voltage supply node.

13. The voltage supply circuit according to claim 1, wherein when the alternating voltage increases from the first voltage to the second voltage on the second capacitor terminal of the adjustable capacitor, a corresponding voltage increase on the voltage supply node is induced, and the voltage supply node is connected to a gate terminal of a power transistor.

14. The voltage supply circuit according to claim 1, further comprising:
   a fixed capacitance capacitor connected between a fixed voltage source and the voltage supply node.

* * * * *